United States Patent
Lou et al.

(10) Patent No.: US 9,793,351 B2
(45) Date of Patent: Oct. 17, 2017

(54) TUNNELLING FIELD EFFECT TRANSISTOR

(71) Applicant: PEKING UNIVERSITY SHENZHEN GRADUATE SCHOOL, Shenzhen (CN)

(72) Inventors: Haijun Lou, Shenzhen (CN); Xinnan Lin, Shenzhen (CN); Dan Li, Shenzhen (CN); Jin He, Shenzhen (CN)

(73) Assignee: Peking University Shenzhen Graduate School, Shenzhen (CN)

( * ) Notice: Subject to any disclaimer, the term of this patent is extended or adjusted under 35 U.S.C. 154(b) by 0 days.

(21) Appl. No.: 14/916,976

(22) PCT Filed: Sep. 1, 2014

(86) PCT No.: PCT/CN2014/085671
§ 371 (c)(1),
(2) Date: Mar. 4, 2016

(87) PCT Pub. No.: WO2015/032296
PCT Pub. Date: Mar. 12, 2015

(65) Prior Publication Data
US 2016/0197145 A1  Jul. 7, 2016

(30) Foreign Application Priority Data

Sep. 6, 2013 (CN) .......................... 2013 1 0403969

(51) Int. Cl.
*H01L 29/10* (2006.01)
*H01L 29/739* (2006.01)
(Continued)

(52) U.S. Cl.
CPC ...... *H01L 29/1033* (2013.01); *H01L 29/0673* (2013.01); *H01L 29/0676* (2013.01);
(Continued)

(58) Field of Classification Search
CPC ............. H01L 29/7391; H01L 29/0688; H01L 29/1033; H01L 29/7827; H01L 29/0847;
(Continued)

(56) References Cited

U.S. PATENT DOCUMENTS

| 2009/0026553 A1* | 1/2009 | Bhuwalka ......... H01L 29/66356 257/402 |
| 2010/0200916 A1* | 8/2010 | Gossner ................ H01L 29/083 257/335 |

(Continued)

FOREIGN PATENT DOCUMENTS

| CN | 101699617 A | 4/2010 |
| CN | 101969061 A | 2/2011 |

(Continued)

OTHER PUBLICATIONS

PCT International Preliminary Report on Patentability Chapter I from PCT/CN2014/085671 dated Mar. 8, 2016, and its English translation from WIPO.

(Continued)

*Primary Examiner* — Bo Fan
(74) *Attorney, Agent, or Firm* — Ladas & Parry, LLP

(57) ABSTRACT

A tunneling field effect transistor, comprising a gate electrode layer, a gate dielectric layer, a source region, a connected region and a drain region, wherein the source region comprises a first source region and a second source region, the second source region comprising an inner layer source region and an outer layer source region. The connected region comprises an expansion region and a high-resistance region. The doping types of materials of the inner layer source and the outer layer source region are opposite, and the forbidden bandwidth of the material of the inner layer source region is less than that of the outer layer source region. The contact surface formed by way of covering the inner layer source region by the outer layer source region is (Continued)

a curved surface. Since a contact surface of an outer layer source region and an inner layer source region of a tunneling field effect transistor is of a curved surface structure, the contact area of the outer layer source region and the inner layer source region is increased, and the probability of tunneling of a carrier through the contact surface is increased. Therefore, the On-state current is increased, thereby having a good current drive capability.

9 Claims, 9 Drawing Sheets

(51) Int. Cl.
*H01L 29/06* (2006.01)
*H01L 29/165* (2006.01)
*H01L 29/08* (2006.01)
*H01L 29/78* (2006.01)

(52) U.S. Cl.
CPC ...... *H01L 29/0688* (2013.01); *H01L 29/0847* (2013.01); *H01L 29/165* (2013.01); *H01L 29/7391* (2013.01); *H01L 29/78* (2013.01); *H01L 29/7827* (2013.01)

(58) Field of Classification Search
CPC . H01L 29/78; H01L 29/0673; H01L 29/0676; H01L 29/165
USPC .................................. 257/9, 77, 335, 402, 27
See application file for complete search history.

(56) References Cited

U.S. PATENT DOCUMENTS

| | | | |
|---|---|---|---|
| 2012/0181549 A1* | 7/2012 | Johnson | ............. H01L 29/0847 257/77 |
| 2012/0298959 A1* | 11/2012 | Verhulst | ................ B82Y 10/00 257/27 |
| 2013/0037823 A1* | 2/2013 | Kanemura | ............ H01L 29/267 257/77 |

FOREIGN PATENT DOCUMENTS

| | | |
|---|---|---|
| CN | 102832256 A | 12/2012 |
| CN | 103474459 A | 12/2013 |
| KR | 100622675 B1 | 9/2006 |

OTHER PUBLICATIONS

English translation from WIPO for PCT Written Opinion from PCT/CN2014/085671 dated Dec. 3, 2014.
ISR for PCT/CN2014/085671 dated Dec. 3, 2014 and its English translation by WIPO.
Written Opinion for PCT/CN2014/085671 dated Dec. 3, 2014 and its English translation by Google Translate/OCR by Abode Acrobat Pro.

* cited by examiner along first direction

TUNNELLING FIELD EFFECT TRANSISTOR

CROSS-REFERENCE TO RELATED APPLICATIONS

This application is the U.S. National Stage of International Patent Application No. PCT/CN2014/085671 filed on Sep. 1, 2014, which claims the benefit of and priority to Chinese Patent Application 201310403969.9 filed on Sep. 6, 2013, the disclosures of which are incorporated herein by reference.

FIELD OF THE INVENTION

The present application relates to semiconductor devices, and more particularly, to tunneling field effect transistors.

BACKGROUND OF THE INVENTION

With development of integrated circuits, power consumption is becoming one important performance index. As a basic unit of an integrated circuit, a field effect transistor having superior performance and low power consumption has been sought. Due to introduction of dual-gate and tri-gate structures as well as techniques with high-k materials and stress silicon, the performances of field effect transistors have been significantly improved. However, a sub-threshold slope of a conventional field effect transistor is not less than ln 10·kT/q on account of limit caused by drift and diffusion, resulting in great difficulties in reduction of power supply voltage and the channel length under identical characteristics. A main solution to break this limit is a PN junction-based tunneling field effect transistor which has attracted wide attention because of its low power consumption and low sub-threshold slope.

In a conventional tunneling field effect transistor, a P (hole-doping) region and an N (electron-doping) region could be formed respectively at the source and drain terminals, and intrinsic material could be used at the intermediate channel. The electron hole could be tunneling transferred from the P region to the N region by a drive voltage, forming tunneling current. Since the conventional tunneling field effect transistor could generate current by tunneling effect, its on-state current may be smaller than that of a conventional field effect transistor having thermal emission mechanism.

SUMMARY OF THE INVENTION

A tunneling field effect transistor disclosed in the present application may include a gate electrode layer, a gate dielectric layer, a source region, a connected region and a drain region.

The source region may include a first source region and a second region, the first source region may contact the second source region in a first direction representing a direction along the channel of the transistor; the second source region may include an inner layer source region and an outer layer source region covering the inner layer source region in a second direction vertical to the first direction;

The connected region may include an expansion region and a high-resistance region covered by the expansion region in the second direction;

The second source region may contact the connected region in the first direction, the connected region may contact the drain region in the first direction; the gate electrode layer may cover the outer layer source region by the gate dielectric layer in the second direction, and the gate dielectric layer may cover the outer layer source region, the expansion region and the drain region in the second direction;

The doping type of materials of the inner layer source region and the outer layer source region may be opposite, the forbidden bandwidth of the material of the inner layer source region may be less than that of the outer layer source region;

The doping type of materials of the outer layer source region, the expansion region and the drain region may be identical.

The contact surface formed by way of covering the inner layer source region by the outer layer source region may be a curved surface.

With the tunneling field effect transistor provided by the present application, since the contact surface of the outer layer source region and the inner layer source region of the tunneling field effect transistor may be of a curved surface structure, the contact area of the outer layer source region and the inner layer source region could be increased, and the probability of tunneling of a carrier through the contact surface could be increased. Therefore, the on-state current thereof could be increased, thereby having a good current drive capability.

DETAILED DESCRIPTION OF THE INVENTION

Figure 1:
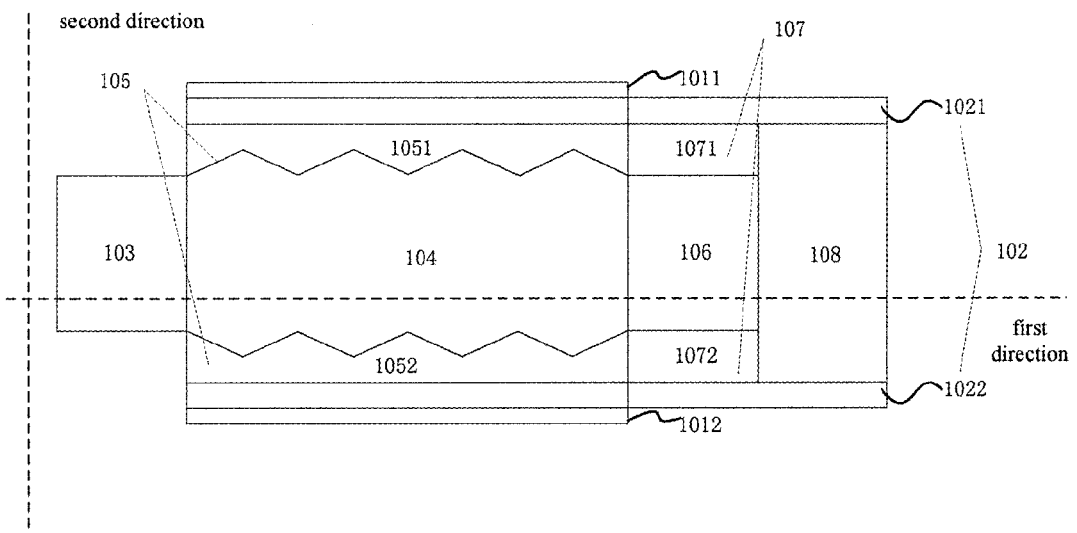
FIG. 1 is a schematic cross-section diagram of a parallel-structured dual-gate tunneling field effect transistor along the first direction.

The present application will be described in detail as below by specific embodiments in conjunction with the accompanying drawings.

Terms used in the present application may be defined as follows:

Equivalent thickness: may be referred to as the thickness of pure $SiO_2$ at the same gate capacitance attained by materials having high dielectric constant value and materials of pure $SiO_2$ when replacing common $SiO_2$ by materials having high dielectric constant value as gate dielectric.

Orientations used in the present application may include: a first direction referring to a direction along the channel of the transistor, a second direction which is vertical to the first direction, and a third direction which is vertical to a plane formed by the first direction and the second direction.

A tunneling field effect transistor provided in an embodiment of the present application may include a gate electrode layer, a gate dielectric layer, a source region, a connected region and a drain region.

The source region may include a first source region and a second source region which may contact the first source region in the first direction. The second source region may include an inner layer source region and an outer layer source region. The outer layer source region may cover the inner layer source region in the second direction which is perpendicular to the first direction. The contact surface formed by way of covering the inner layer source region by the outer layer source region may be a curved surface.

The connected region may include an expansion region and a high-resistance region which may be covered by the expansion region in the second direction.

The source region may contact the connected region in the first direction, and the connected region may contact the drain region in the first direction.

The gate electrode layer may cover the outer layer source region in the second direction through the gate dielectric layer which may cover the outer layer source region, the expansion region and the drain region in the second direction.

The doping types of materials of the inner layer source region and outer layer source region may be opposite, and the forbidden bandwidth of the material of the inner layer source region may be less than that of the outer layer source region. The doping types of materials of the outer layer source region, the expansion region and the drain region may be identical.

The contact surface formed by way of covering the inner layer source region by the outer layer source region may be a curved surface.

Preferably, a profile of the contact surface formed by way of covering the inner layer source region by the outer layer source region may be of a corrugated, wedgy or jagged structure in a direction which is vertical to the contact surface. A peak shape of the corrugated structure may be adjusted, for example a tip shape, an arc shape, etc. The corrugation may be adjustable, such as a standard waveform, waveform having only peak without troughs, or waveform having only trough without peak. A distance between a peak and a trough may be adjustable, which can be continuous or intermittent. The wedgy structure and the jagged structure may be similar to the corrugated structure, which will not be repeated herein.

The gate electrode layer and the gate dielectric layer may be of a single-tier, a dual-tier or a tri-tier structure respectively. The number of tier of the gate electrode layer may be the same as that of the gate dielectric layer, and each tier of the gate electrode layer may cover each corresponding tier of the gate dielectric layer.

The first source region, the second source region, the connected region and the drain region may be cuboid or cylindrical.

Tunneling field effect transistors having a variety of structures may be formed in accordance with different numbers of tier of the gate electrode layer and the gate dielectric layer, and various shapes of the first source region, the second source region, the connected region and the drain region. The tunneling field effect transistors will be described in detail as below by specific embodiments.

First Embodiment

Figure 2:
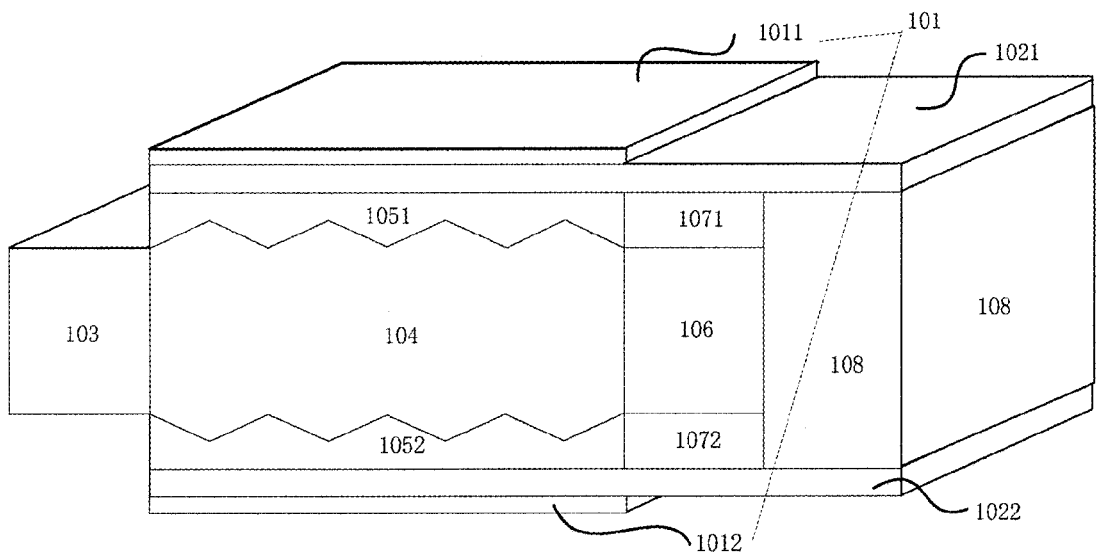
FIG. 2 is a schematic three-dimensional diagram of the parallel-structured dual-gate tunneling field effect transistor.

As shown in FIG. 1 and FIG. 2, a tunneling field effect transistor may be formed when the first source region, the second source region, the connected region and the drain region are cuboid and the gate electrode layer is of a two-tier structure. In the embodiment, the dual-gate tunneling field effect transistor shown in FIG. 1 and FIG. 2 may be referred to as a parallel-structured dual-gate tunneling field effect transistor. FIG. 1 schematically shows a cross-section diagram of the parallel-structured dual-gate tunneling field effect transistor along the first direction, and FIG. 2 schematically shows a three-dimensional diagram of the parallel-structured dual-gate tunneling field effect transistor. The parallel-structured dual-gate tunneling field effect transistor may include a gate electrode layer 101, a gate dielectric layer 102, a first source region 103, an inner layer source region 104, an outer layer source region 105, a high-resistance region 106, an expansion region 107 and a drain region 108.

The gate electrode layer 101 may include a first gate electrode layer 1011 and a second gate electrode layer 1012.

The gate dielectric layer 102 may include a first gate dielectric layer 1021 and a second gate dielectric layer 1022.

The outer layer source region 105 may be divided into a first outer layer source region 1051 and a second outer layer source region 1052 by the inner layer source region 104.

The expansion region 107 may be divided into a first expansion region 1071 and a second expansion region 1072 by the high-resistance region 106.

The gate electrode layer 101 may cover the first outer layer source region 1051 and the second outer layer source region 1052 in a planar manner by the gate dielectric layer 102 in the second direction. Particularly, the first gate electrode layer 1011 may cover the first outer layer source region 1051 in a planar manner by the first gate dielectric layer 1021 in the second direction, and the second gate electrode layer 1012 may cover the second outer layer source region 1052 in a planar manner by the second gate dielectric layer 1022 in the second direction.

The gate dielectric layer 102 may cover the second source region, the expansion region 107 and the drain region 108 respectively in a planar manner in the second direction. The second source region may include the first outer layer source region 1051, the second outer layer source region 1052 and the inner layer source region 104. The first gate dielectric layer 1021 may cover the first outer layer source region 1051, the first expansion region 1071 and the drain region 108 in a planar manner in the second direction, and the second gate dielectric layer 1022 may cover the second outer layer source region 1052, the second expansion region 1072 and the drain region 108 in a planar manner in the second direction.

Both the gate electrode layer 101 and the gate dielectric layer 102 may cover in a planar manner which is different from a curved manner. Covering in a curved manner may include, but not limit to, covering in an annular manner.

In the embodiment, work function of material of the gate electrode layer 101 may be adjusted within 3.8-5.0 electron volts, the equivalent thickness of the gate dielectric layer 102 may be 0.5-2 nm, the materials of the first source region 103 and the inner layer source region 104 may be germanium, the materials of the outer layer source region 105, the expansion region 107 and the drain region 108 may be silicon, the material of the gate dielectric layer 102 may be hafnium oxide, and the material of the high-resistance 106 may be silicon dioxide.

In the embodiment, the first source region 103 and the drain source region 108 may be 10 nm in length, the gate electrode layer 101, the outer layer source region 105 and the inner layer source region 104 may be 50 nm in length, and the expansion region 107 and the high-resistance region 106 may be 10 nm in length. The thickness of the first source region 103, the boundary of the inner layer source region 104 and the thickness of the high-resistance region 105 may be identical, for example 10 nm. The boundaries of the first and second outer layer source regions 1051, 1052 may be the same as the thicknesses of the first and second expansion regions 1071, 1072, for example 4 nm. The thickness of the drain region 108 may be 18 nm, and the equivalent thickness of the gate dielectric layer 102 may be 1 nm.

The aforementioned limit of materials, length and thickness may only one example of the parallel-structured dual-gate tunneling field effect transistor in the embodiment, and it may be understood that the materials, length and thickness shall not be limited to the aforementioned limit. The thickness of the first source region 103, the boundary of the inner layer source region 104 and the thickness of the high-resistance region 106 may be identical, and the boundary of the outer layer source region 105 and the thickness of the expansion region 107 may be identical, which may only one example of the parallel-structured dual-gate tunneling field effect transistor in the embodiment, and the thicknesses thereof shall not be construed as to be the same.

In the embodiment, the first source region 103 and the inner layer source region 104 may be doped with boron with a doping concentration of $1\times10^{21}$ cm$^{-3}$, and the outer layer source region 105, the expansion region 107 and the drain region 108 may be doped with phosphorus with doping concentrations of $5\times10^{18}$ cm$^{-3}$, $1\times10^{16}$ cm$^{-3}$, and $1\times10^{19}$ cm$^{-3}$ respectively. The aforementioned limit of doped materials and doping concentrations may only be one example of the parallel-structured dual-gate tunneling field effect transistor in the embodiment, and it may be understood that the doped materials and doping concentrations shall not be limited to the aforementioned limit.

FIG. 3 to FIG. 8 schematically show performance indexes of the parallel-structured dual-gate tunneling field effect transistor of the embodiment researched and obtained by simulation based on the Sentaurus TCAD software. Influence on the forbidden bandwidth by band-to-band tunneling mechanism and doping concentration, influence on mobility ratio by electric field and doping concentration, generation of charge carrier and recombination effects, as well as quantum effects may be taken into consideration in the simulation. The results which are comparisons of the parallel-structured dual-gate tunneling field effect transistor in the embodiment and conventional tunneling field effect transistor are schematically shown in FIGS. 3-8. The conventional tunneling field effect transistor and the parallel-structured dual-gate tunneling field effect transistor in the embodiment is different in the structure of the contact surface of the inner layer source region and the outer layer source region. The contact surface of the inner layer source region and the outer layer source region may be planar in the conventional tunneling field effect transistor, while the contact surface in the embodiment may be a curved surface.

Figure 3:
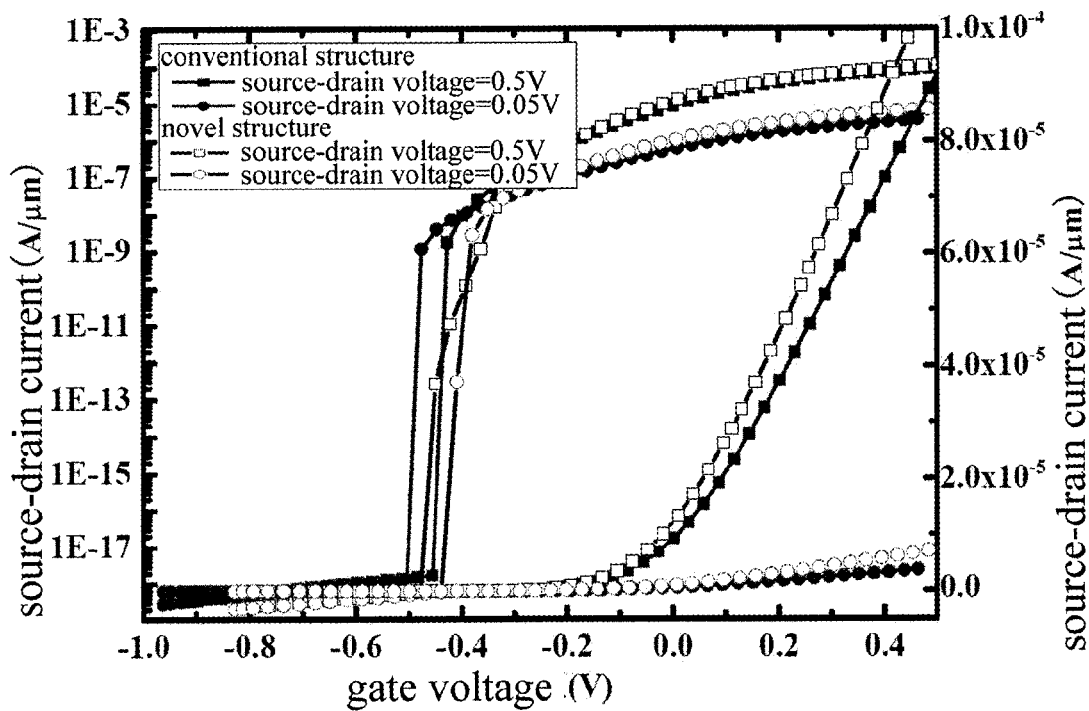
FIG. 3 is a schematic diagram showing characteristic of transfer output of the parallel-structured dual-gate tunneling field effect transistor in an embodiment.

FIG. 3 schematically shows characteristic of transfer output of the parallel-structured dual-gate tunneling field effect transistor in the embodiment. The selected source-drain voltage may be 0.5 volts and 0.05 volts respectively in FIG. 3. As can be seen from FIG. 3, regardless of 0.5 volts and 0.05 volts, the source-drain current, i.e. on-state current, in the parallel-structured dual-gate tunneling field effect transistor in the embodiment may be increased, thus raising current drive capability. Meanwhile it can be seen from FIG. 3 that occurrence of bipolar effect may be suppressed by the parallel-structured dual-gate tunneling field effect transistor in the embodiment.

Figure 4:
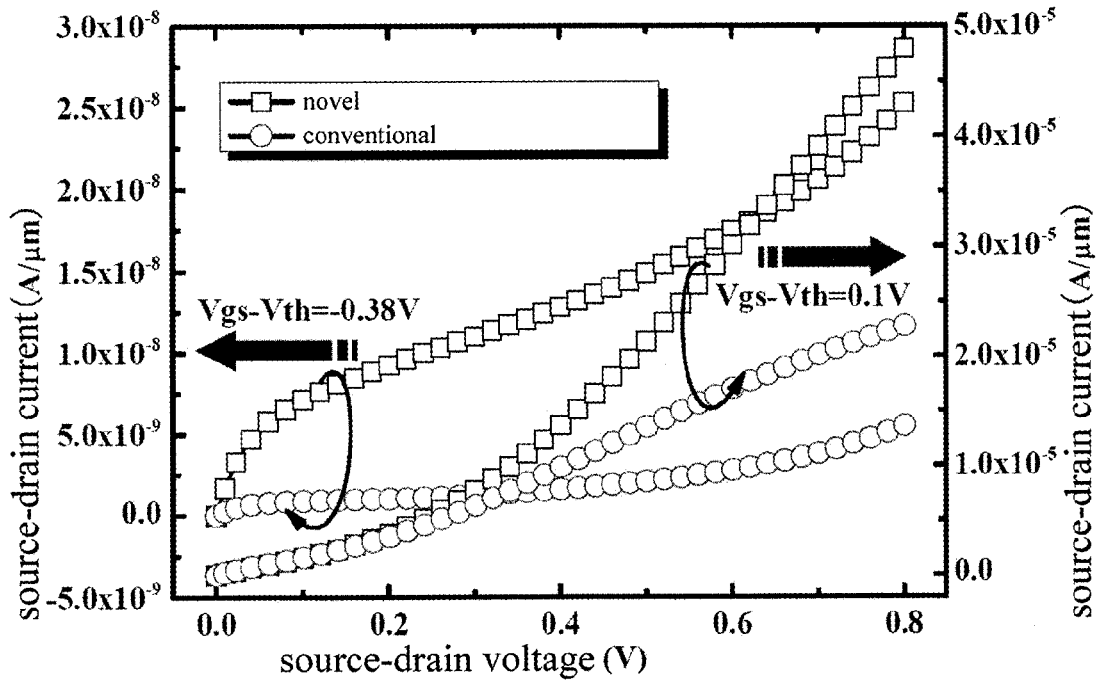
FIG. 4 is a schematic diagram showing characteristic of current output of the parallel-structured dual-gate tunneling field effect transistor in the embodiment.

FIG. 4 schematically shows characteristic of current output of the parallel-structured dual-gate tunneling field effect transistor in the embodiment. It can be seen from FIG. 4 that the parallel-structured dual-gate tunneling field effect transistor in the embodiment may have a larger source-drain current and more powerful drive capability in different overdrive voltages (Vgs-Vth).

Figure 5:
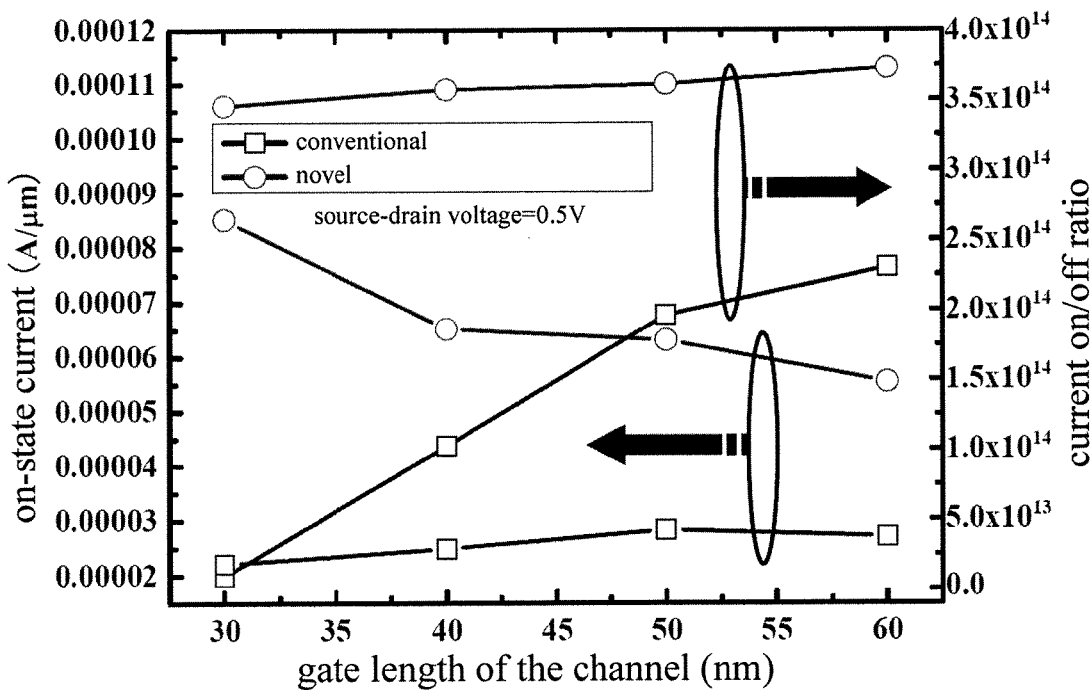
FIG. 5 is a schematic diagram showing on-state current and on/off ratio of the parallel-structured dual-gate tunneling field effect transistor in the embodiment.

FIG. 5 schematically shows on-state current and on/off ratio of the parallel-structured dual-gate tunneling field effect transistor in the embodiment. The parallel-structured dual-gate tunneling field effect transistor in the embodiment comparing with the conventional tunneling field effect transistor in the comparisons of the on-state current and the on/off ratio at a source-drain voltage of 0.5 volts may be shown in FIG. 5 in accordance with different gate lengths. As can be seen from FIG. 5, the parallel-structured dual-gate tunneling field effect transistor in the embodiment may have a better on-state current and a larger on/off ratio.

Since a contact surface of an outer layer source region and an inner layer source region of a tunneling field effect transistor is of a curved surface structure in the parallel-structured dual-gate tunneling field effect transistor in the embodiment, the contact area of the outer layer source region and the inner layer source region is increased, and the probability of tunneling of a carrier through the contact surface is increased. Therefore, the on-state current is increased, thereby having a good current drive capability. Moreover the parallel-structured dual-gate tunneling field effect transistor in the embodiment may be, proved by experiments, good at suppressing the occurrence of bipolar effect.

Figure 6:
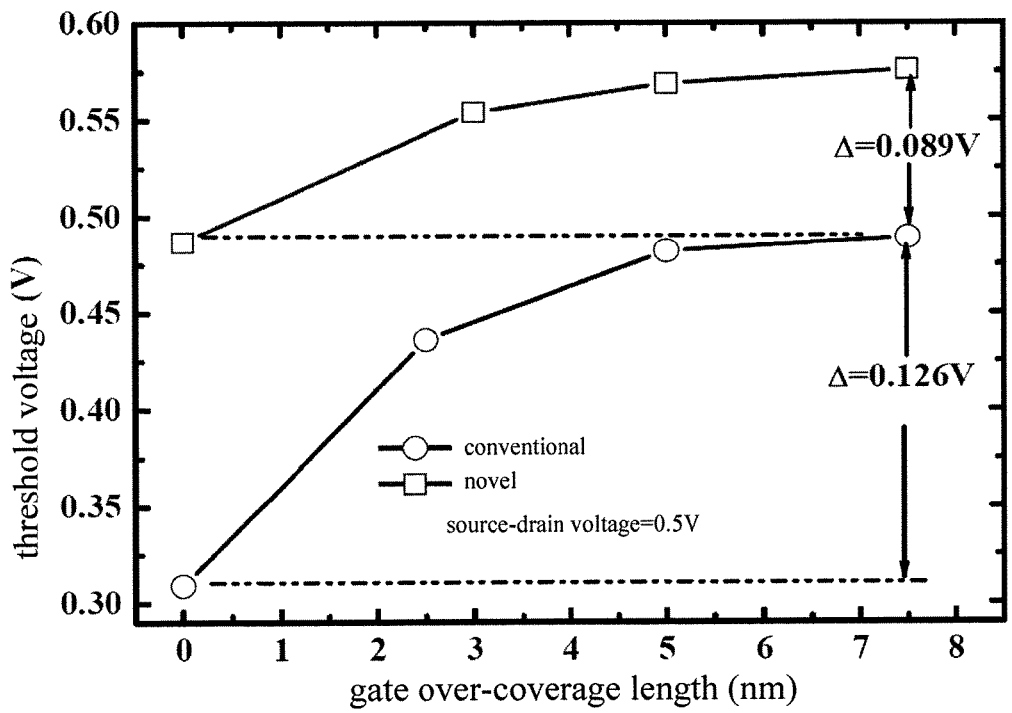
FIG. 6 is a schematic diagram showing influence on threshold voltage of the parallel-structured dual-gate tunneling field effect transistor in the embodiment by gate over-coverage levels.

Stabilizing threshold voltage, an important parameter for devices, is basic for a circuit to work effectively. FIG. 6 schematically shows influence on threshold voltage of the parallel-structured dual-gate tunneling field effect transistor in the embodiment by gate over-coverage levels. As can be seen from FIG. 6, the threshold voltage of the parallel-structured dual-gate tunneling field effect transistor in the embodiment may be less influenced by the gate over-coverage levels, of which the gate over-coverage length is from 0 nm to 7.5 nm and the change of the threshold voltage is 0.089 volts, while the change of the threshold voltage of the conventional tunneling field effect transistor is 0.126 volts.

Figure 7:
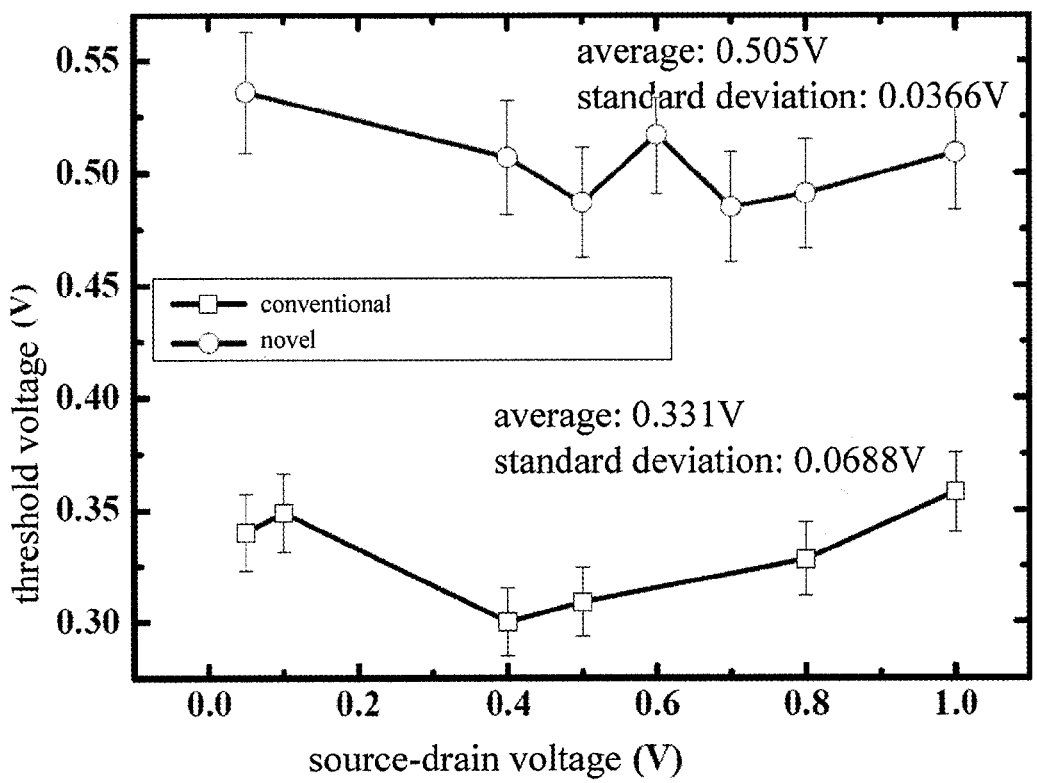
FIG. 7 is a schematic diagram showing influence on threshold voltage of the parallel-structured dual-gate tunneling field effect transistor in the embodiment by a source-drain voltage.

FIG. 7 schematically shows influence on threshold voltage of the parallel-structured dual-gate tunneling field effect transistor in the embodiment by the source-drain voltage. The fluctuation of the threshold voltage caused by the change of source-drain voltage in the parallel-structured dual-gate tunneling field effect transistor in the embodiment is 36.6 millivolts in terms of standard deviation, while the fluctuation of the threshold voltage in the fluctuation of the threshold voltage is 68.8 millivolts.

Since part of source region under the gate electrode layer in the parallel-structured dual-gate tunneling field effect transistor in the embodiment is formed to be a curved structure, the electric field may be mainly concentrated below the gate electrode layer. The electric field may change little when the gate over-coverage occurs, thus suppressing influence on the threshold voltage by the gate over-coverage level. Furthermore, since the electric field is mainly concentrated at the top end of the curved structure, the on and off of the transistor may be less influenced by the source-drain voltage, that is, the threshold voltage thereof is less influenced by the source-drain voltage. The parallel-structured dual-gate tunneling field effect transistor in the embodiment may be less influenced by the gate over-coverage level and the source-drain voltage.

Figure 8:
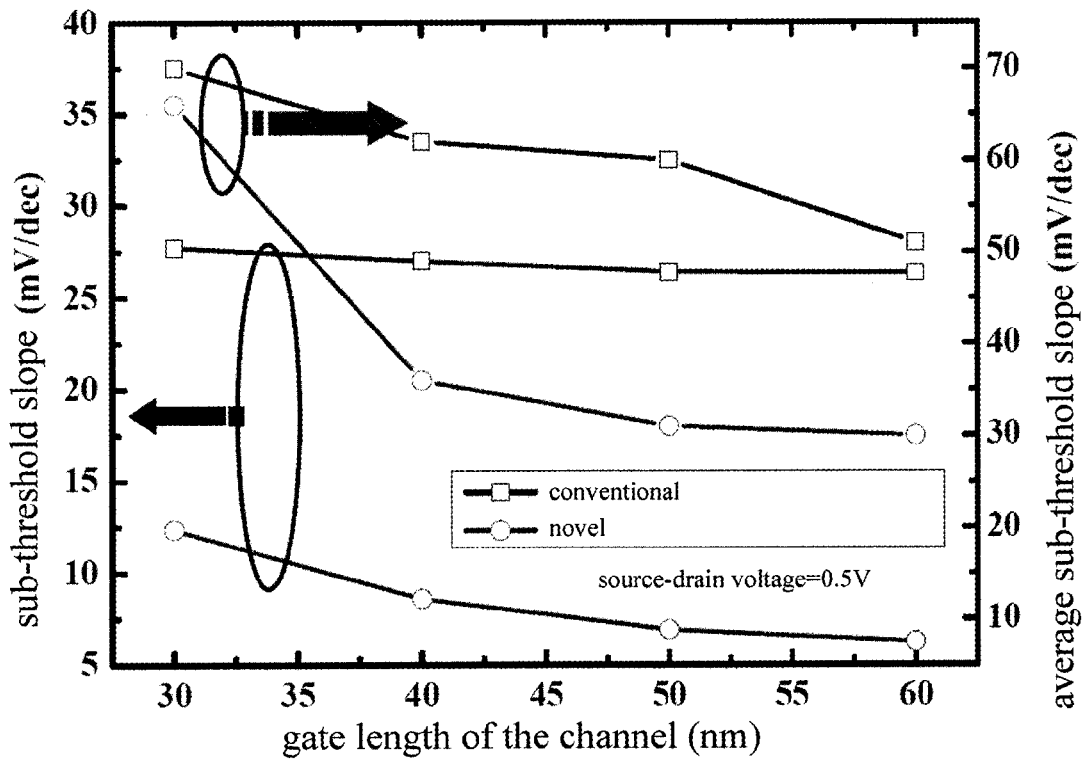
FIG. 8 is a schematic diagram showing influence on sub-threshold characteristic by a gate length in the parallel-structured dual-gate tunneling field effect transistor in the embodiment.

FIG. 8 schematically shows influence on sub-threshold characteristic by gate length in the parallel-structured dual-gate tunneling field effect transistor in the embodiment. As can be seen from FIG. 8, regardless of sub-threshold slope of specified gate length or average sub-threshold slope, they may decrease obviously in the parallel-structured dual-gate tunneling field effect transistor in the embodiment compared with the conventional tunneling field effect transistor. The reason for such improvement may be the curved structured of the contact surface formed by the inner layer source region and the outer layer source region. Due to the curved structured, part of the electric field may be concentrate, which may be in favor of carrier tunneling.

Second Embodiment

Figure 9:
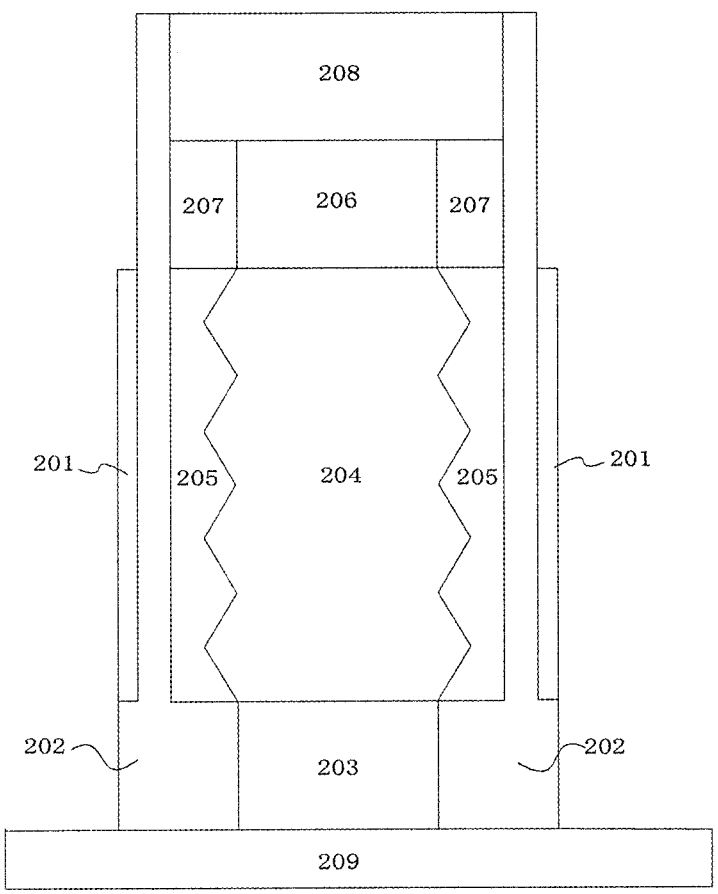
FIG. 9 is a schematic cross-section diagram of a vertical-structured dual-gate tunneling field effect transistor along the first direction.
Figure 10:
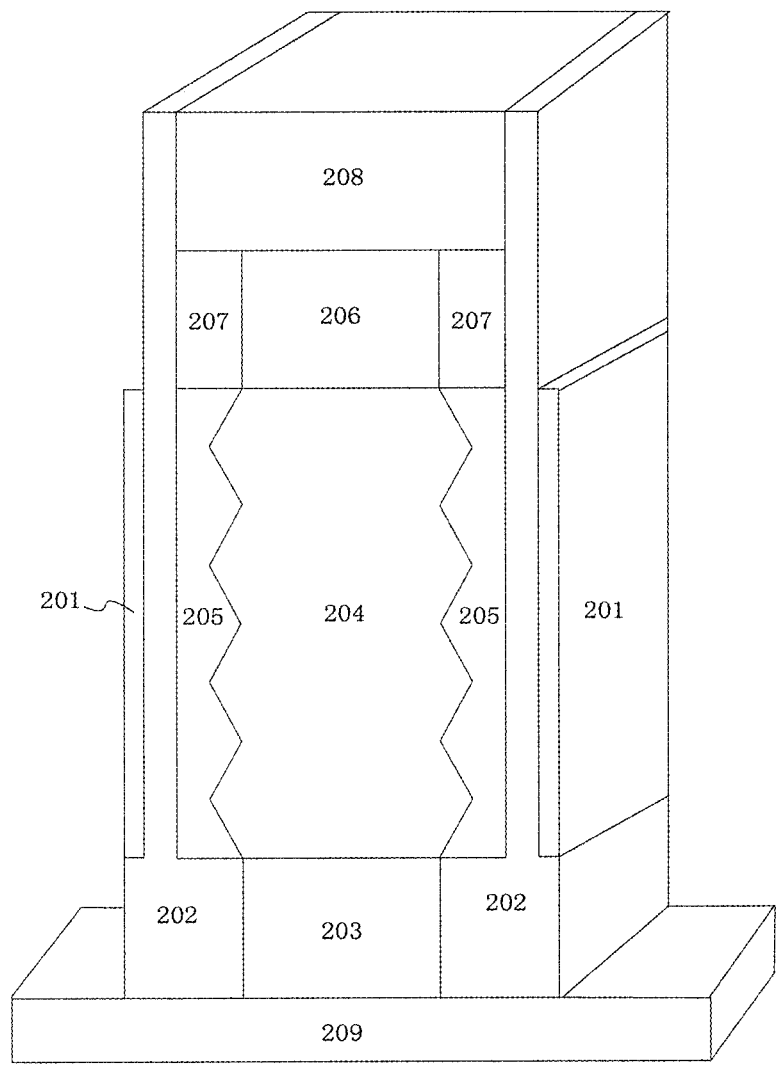
FIG. 10 is a schematic three-dimensional diagram of the vertical-structured dual-gate tunneling field effect transistor.

Please referring to FIGS. 9-10, in the embodiment, the dual-gate tunneling field effect transistor shown in FIGS. 9-10 may be referred to as a vertical-structured dual-gate tunneling field effect transistor. FIG. 9 schematically shows a cross-section diagram of the vertical-structured dual-gate tunneling field effect transistor along the first direction, and FIG. 10 schematically shows a three-dimensional diagram of the vertical-structured dual-gate tunneling field effect transistor.

As can be seen from FIG. 9 with reference to FIG. 1, the vertical-structured dual-gate tunneling field effect transistor, similar to the parallel-structured dual-gate tunneling field effect transistor, may include a gate electrode layer 201, a gate dielectric layer 202, a first source region 203, an inner layer source region 204, an outer layer source region 205, a high-resistance region 206, an expansion region 207 and a drain region 208. The vertical-structured dual-gate tunneling field effect transistor may also include a substrate 209 which may contact the first source region 203.

The second embodiment and the first embodiment may be similar substantially in the structure except the difference therebetween that the vertical-structured dual-gate tunneling field effect transistor may further include the substrate 209. However, since the production process of the parallel-structured transistor may be different from that of the vertical-structured transistor, and different processes may produce devices with various performances, the parallel-structured transistor and the vertical-structured transistor may be different devices.

Third Embodiment

Figure 11:
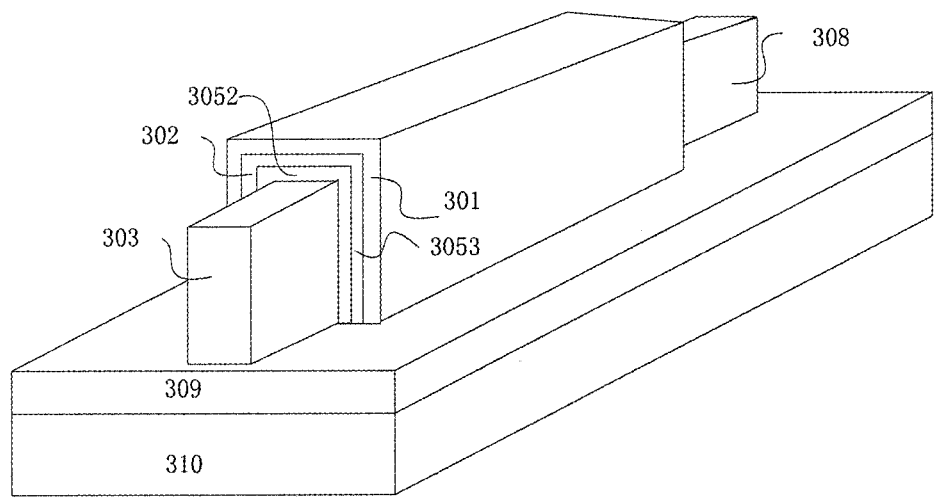
FIG. 11 is a schematic three-dimensional diagram of a tri-gate tunneling field effect transistor.
Figure 12:
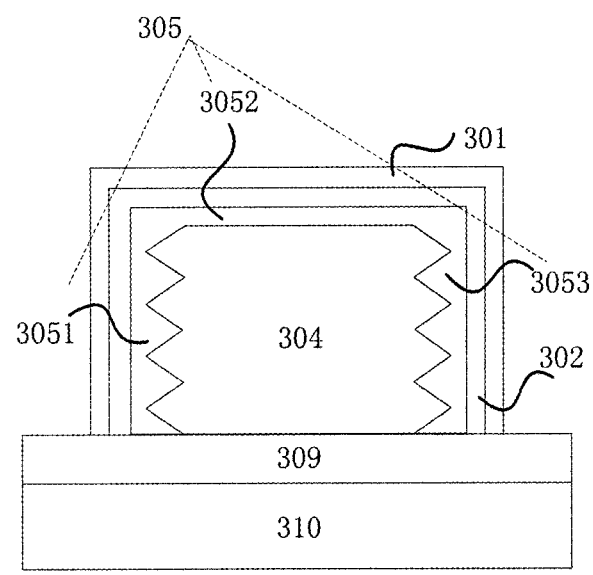
FIG. 12 is a schematic cross-section diagram of the second source region of the tri-gate tunneling field effect transistor along the second direction.
Figure 13:
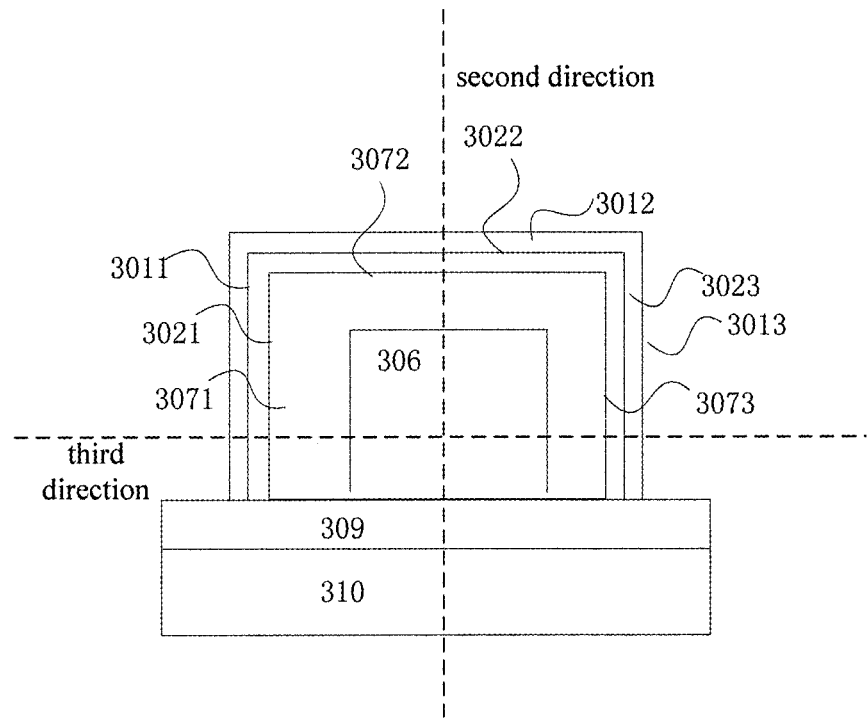
FIG. 13 is a schematic cross-section diagram of the connected source region of the tri-gate tunneling field effect transistor along the second direction.
Figure 14:
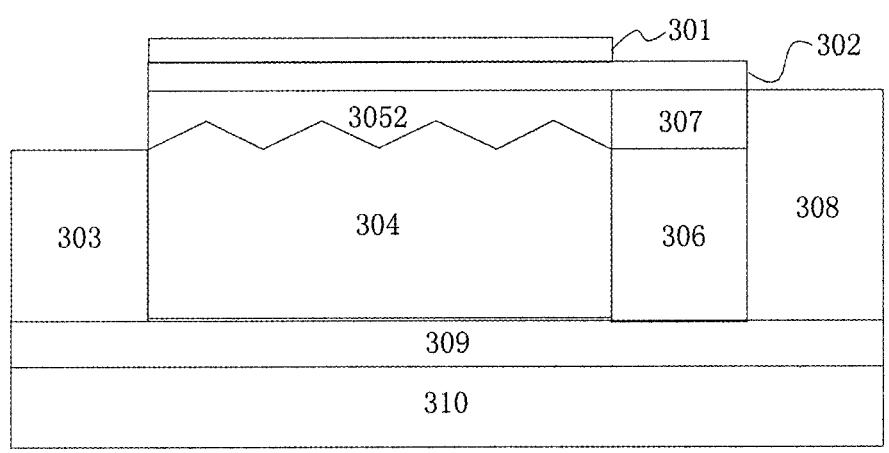
FIG. 14 is a schematic cross-section diagram of the tri-gate tunneling field effect transistor along the first direction.

FIGS. 11-14 schematically shows a tunneling field effect transistor which may be formed when the first source region, the second source region, the connected region and the drain region are cuboid, and the gate electrode layer is of a tri-tier structure. FIG. 11 schematically shows a three-dimensional diagram of the tri-gate tunneling field effect transistor, FIG. 12 schematically shows a cross-section diagram of the second source region of the tri-gate tunneling field effect transistor along the second direction, FIG. 13 schematically shows a cross-section diagram of the connected source region of the tri-gate tunneling field effect transistor along the second direction, and FIG. 14 schematically shows a cross-section diagram of the tri-gate tunneling field effect transistor along the first direction.

As shown in FIGS. 11-14, the tri-gate tunneling field effect transistor in the embodiment may further include an insulating layer 309 and a substrate layer 310. The insulating layer 309 may cover the substrate layer 310 in the second direction. The first source region 303, the second source region, the connected region and the drain region 308 may contact the insulting layer 309 in the second direction.

The gate electrode layer 301 may include a first gate electrode layer 3011, a second gate electrode layer 3012 and a third gate electrode layer 3013.

The gate dielectric layer 302 may include a first gate dielectric layer 3021, a second gate dielectric layer 3022 and a third gate dielectric layer 3023.

The outer layer source region 305 may be divided into a first outer layer source region 3051, a second outer layer source region 3052 and a third outer layer source region 3053 by the inner layer source region.

The expansion region 307 may be divided into a first expansion region 3071, a second expansion region 3072, and a third expansion region 3073 by the high-resistance region 306.

The gate electrode layer 301 may cover the first outer layer source region 3051, the second outer layer source region 3052 and the third outer layer source region 3053 in a planar manner by the gate dielectric layer. Each tier of the gate dielectric layer may cover each outer layer source region by each tier of the gate dielectric layer in a planar manner, that is, a tier of the gate dielectric layer and a tier of the gate electrode layer may cover upon the first outer layer source region 3051, a second outer layer source region 3052 and a third outer layer source region 3053 in a planar manner. Particularly, the first gate electrode layer 3011 may cover the first outer layer source region 3051 in a planar manner in the third direction, the second gate electrode layer 3012 may cover the second outer layer source region 3052 in a planar manner in the second direction, and the third gate electrode layer 3013 may cover the third outer layer source region 3053 in a planar manner in the second direction.

The gate dielectric layer 302 may cover the second source region, the expansion region and the drain region 308 respectively in a planar manner. Particularly, the first gate dielectric layer 3021 may cover the first outer layer source region 3051, the first expansion region 3071 and the drain region 308 in a planar manner in the third direction, the second gate dielectric layer 3022 may cover the second outer layer source region 3052, the second expansion region 3072 and the drain region 308 in a planar manner in the second direction, and the third gate dielectric layer 3023 may cover the third outer layer source region 3053, the third expansion region 3073 and the drain region 308 in a planar manner in the third direction.

Fourth Embodiment

Figure 15:
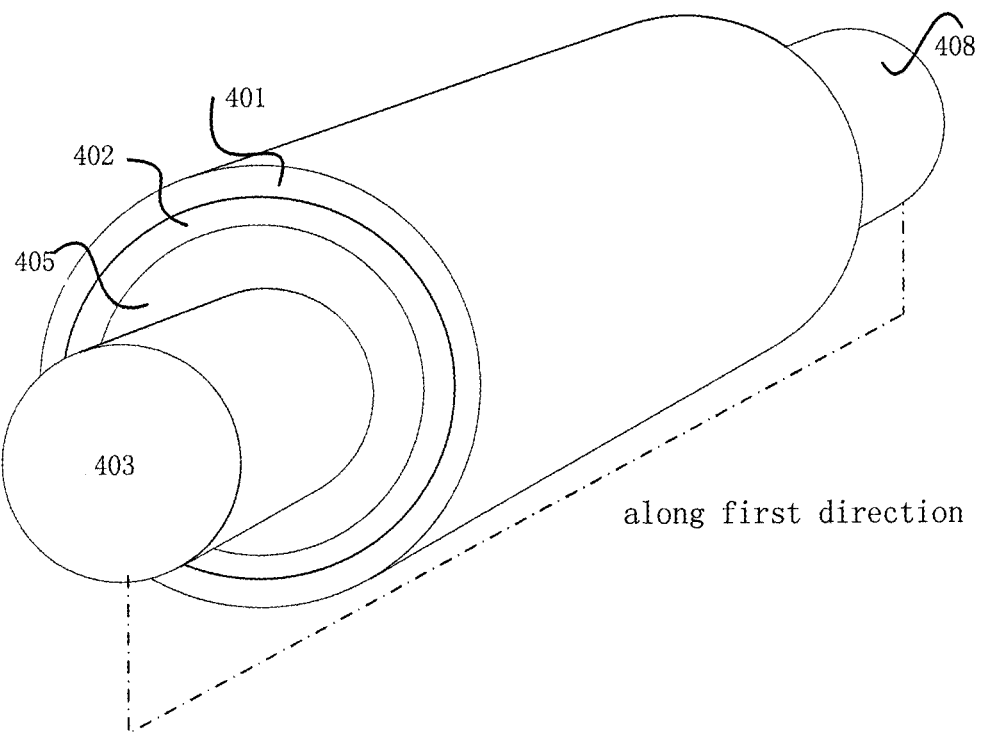
FIG. 15 is a schematic three-dimensional diagram of an annular tunneling field effect transistor.
Figure 16:
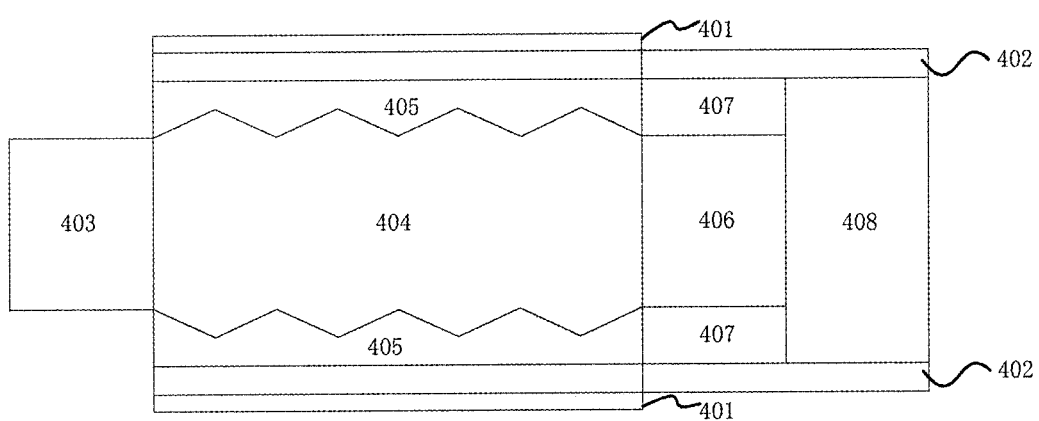
FIG. 16 is a schematic cross-section diagram of the annular tunneling field effect transistor along the first direction.

FIGS. 15-16 schematically shows a tunneling field effect transistor which is formed when the first source region, the second source region, the connected region and the drain region are cylindrical and the gate electrode layer is of a single-tier structure. In the embodiment, the tunneling field effect transistor shown in FIGS. 15-16 may be referred to as an annular tunneling field effect transistor. FIG. 15 schematically shows a three-dimensional diagram of the annular tunneling field effect transistor, and FIG. 16 schematically shows a cross-section diagram of the annular tunneling field effect transistor along the first direction. As can be seen from FIG. 16, the cross-section diagram of the annular tunneling field effect transistor is similar to that of the parallel-structured dual-gate tunneling field effect transistor. The annular tunneling field effect transistor may include a gate electrode layer 401, a gate dielectric layer 402, a first source region 403, an inner layer source region 404, an outer layer source region 405, a high-resistance region 406, an expansion region 407 and a drain region 408. The difference between FIG. 16 and FIG. 1 may be in that, the expansion region and the high-resistance region may be cuboid in FIG. 1 and the expansion region may be divided into a first expansion region and a second expansion region by the high-resistance region, while the high-resistance region 406 in FIG. 16 may be cylindrical as shown in FIG. 15, the expansion region 407 may cover the high-resistance region in an annular manner and may be not divided into two region by the high-resistance region. Similarly, in FIG. 16, the outer layer source region 405 may cover the inner layer source region 404 in an annular manner, the gate electrode layer 401 may cover the second source region by the gate dielectric layer 402 in an annular manner, the gate dielectric layer 402 may cover the second source region, the connected region and the drain region in an annular manner. Particularly, the gate electrode layer 401 may cover the outer layer source region 405 by the gate dielectric layer 402 in an annular manner, and the gate dielectric layer 402 may cover the outer layer source region 405, the expansion region 407 and the drain region 408 in an annular manner.

From the above, since a contact surface of an outer layer source region and an inner layer source region of a tunneling field effect transistor is of a curved surface structure in the present application, the contact area of the outer layer source region and the inner layer source region is increased, and the probability of tunneling of a carrier through the contact surface is increased. Therefore, the On-state current is increased, thereby having a good current drive capability.

Since a contact surface of an outer layer source region and an inner layer source region of a tunneling field effect transistor is of a curved surface structure, the contact area of the outer layer source region and the inner layer source region is increased, and the probability of tunneling of a carrier through the contact surface is increased, thereby having a good sub-threshold characteristic.

The electric field may be mainly concentrated at the curved section due to the curved structure. The electric field may change little when the gate over-coverage occurs, thus suppressing influence on the threshold voltage by the gate over-coverage level. Furthermore, since the electric field is mainly concentrated at the top end of the curved structure, the on and off of the transistor may be determined with less influence by the source-drain voltage, that is, the threshold voltage thereof is less influenced by the source-drain voltage. Accordingly the transistor may be good at suppressing the fluctuation of the threshold voltage.

Moreover, proved by experiments, the transistor may be good at suppressing the occurrence of bipolar effect.

The foregoing descriptions of specific examples are intended to illustrate, appreciate and not to limit the present disclosure. Various changes and modifications may be made to the aforesaid embodiments by those skilled in the art without departing from the spirit of the present disclosure.

What is claimed is:

1. A tunnelling field effect transistor, comprising a gate electrode layer, a gate dielectric layer, a source region, a connected region and a drain region, wherein
   the source region comprises a first source region and a second source region; the second source region comprises an inner layer source region and an outer layer source region, the first source region contacts the inner layer source region of the second source region in a first direction representing a direction along the channel of the transistor, the outer layer source region covers the inner layer source region in a second direction vertical to the first direction, the outer layer source region is isolated from the first source region;
   the connected region comprises an extension region and a high-resistance region covered by the extension region in the second direction;
   the second source region contacts the connected region in the first direction, the connected region contact the drain region in the first direction;
   the gate electrode layer covers the outer layer source region by the gate dielectric layer in the second direction, the gate dielectric layer covers the outer layer source region, the extension region and the drain region in the second direction;
   the doping types of materials of the inner layer source region and the outer layer source region are opposite, the width of forbidden band of the material of the inner layer source region is less than that of the outer layer source region;
   the doping types of materials of the outer layer source region, the extension region and the drain region is identical; and
   the contact surface formed by way of covering the inner layer source region by the outer layer source region is a curved surface.

2. The tunnelling field effect transistor of claim 1, wherein a profile of the contact surface formed by way of covering the inner layer source region by the outer layer source region is of a corrugated, wedgy or jagged profile in a direction vertical to the contact surface.

3. The tunnelling field effect transistor of claim 1, wherein the gate electrode layer and the gate dielectric layer are of a single-tier, dual-tier or tri-tier structure respectively, the number of tier of the gate electrode layer and that of the gate dielectric layer are identical, and each tier of the gate electrode layer covers each tier of the gate dielectric layer.

4. The tunnelling field effect transistor of claim 3, wherein the first source region, the second source region, the connected region and the drain region are cuboid or cylindrical.

5. The tunnelling field effect transistor of claim 4, wherein the first source region, the second source region, the connected region and the drain region are cuboid and the gate electrode layer is of a dual-tier structure,
the gate electrode layer comprises a first gate electrode layer and a second gate electrode layer;
the gate dielectric layer comprises a first gate dielectric layer and a second gate dielectric layer;
the outer layer source region is divided into a first outer layer source region and a second outer layer source region by the inner layer source region;
the extension region is divided into a first extension region and a second extension region by the high-resistance region;
the gate electrode layer covers the first outer layer source region and the second outer layer source region in a planar manner by the gate dielectric layer in the second direction, wherein the first gate electrode layer covers the first outer layer source region in a planar manner in the second direction, and the second gate electrode layer covers the second outer layer source region in a planar manner in the second direction;
the gate dielectric layer covers the second source region, the extension region and the drain region respectively in a planar manner in the second direction, wherein the first gate dielectric layer covers the first outer layer source region, the first extension region and the drain region in a planar manner in the second direction, and the second gate dielectric layer covers the second outer layer source region, the second extension region and the drain region in a planar manner in the second direction.

6. The tunnelling field effect transistor of claim 5, wherein the tunnelling field effect transistor further comprises a substrate layer, and the gate dielectric layer further comprises a first source layer in a region thereof covered in a planar manner in the second direction.

7. The tunnelling field effect transistor of claim 4, wherein the first source region, the second source region, the connected region and the drain region are cuboid and the gate electrode layer is of a tri-tier structure,
the gate electrode layer comprises a first gate electrode layer, a second gate electrode layer and a third gate electrode layer;
the gate dielectric layer comprises a first gate dielectric layer, a second gate dielectric layer and a third gate dielectric layer;
the tunnelling field effect transistor further comprises an insulating layer and a substrate layer covered by the insulating layer in a planar manner in the second direction; the first source region, the second source region, the connected region and the drain region contact the insulating layer in the second direction;
the outer layer source region is divided into a first outer layer source region, a second outer layer source region and a third outer layer source region by the inner layer source region;
the extension region is divided into a first extension region, a second extension region and a third extension region by the high-resistance region;
the gate electrode layer covers the first outer layer source region, the second outer layer source region and the third outer layer source region in a planar manner by the gate dielectric layer in the second direction, wherein the first gate electrode layer covers the first outer layer source region in a planar manner in a third direction vertical to a plane formed by the first direction and the second direction, the second gate electrode layer covers the second outer layer source region in a planar manner in the second direction, and the third gate electrode layer covers the third outer layer source region in a planar manner in the third direction; and
the gate dielectric layer covers the second source region, the extension region and the drain region respectively in a planar manner in the second direction, wherein the first gate dielectric layer covers the first outer layer source region, the first extension region and the drain region in a planar manner in the third direction, the second gate dielectric layer covers the second outer layer source region, the second extension region and the drain region in a planar manner in the second direction, and the third gate dielectric layer covers the third outer layer source region, the third extension region and the drain region in a planar manner in the third direction.

8. The tunnelling field effect transistor of claim 4, wherein the first source region, the second source region, the connected region and the drain region are cylindrical and the gate electrode layer is of a single-tier structure,
the outer layer source region covers the inner layer source region in an annular manner;
the extension region covers the high-resistance region in an annular manner; and
the gate electrode layer covers the second source region in an annular manner by the gate dielectric layer covering the second source region, the connected region and the drain region in an annular manner.

9. The tunnelling field effect transistor of claim 4, wherein the work function of material of the gate electrode layer is within 3.8-5.0 electron volts, and the equivalent thickness of the gate dielectric layer is 0.5-2 nm.

* * * * *